(12) United States Patent
Winkler et al.

(10) Patent No.: US 8,742,873 B2
(45) Date of Patent: *Jun. 3, 2014

(54) MEMS RESONATOR DEVICES

(71) Applicant: Infineon Technologies AG, Neubiberg (DE)

(72) Inventors: Bernhard Winkler, Regensburg (DE); Florian Schoen, Altdorf (DE); Mohsin Nawaz, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/929,058

(22) Filed: Jun. 27, 2013

(65) Prior Publication Data

US 2013/0293319 A1    Nov. 7, 2013

Related U.S. Application Data

(63) Continuation of application No. 13/241,638, filed on Sep. 23, 2011, now Pat. No. 8,476,990, which is a continuation of application No. 12/354,029, filed on Jan. 15, 2009, now Pat. No. 8,040,207.

(51) Int. Cl.
*H03H 9/24* (2006.01)
*H03H 9/125* (2006.01)
*H03H 9/02* (2006.01)

(52) U.S. Cl.
CPC ....... *H03H 9/02448* (2013.01); *H03H 9/02244* (2013.01); *H03H 9/02433* (2013.01)
USPC ............ 333/186; 333/199; 257/415; 310/309

(58) Field of Classification Search
USPC .......... 333/186, 197, 199, 200; 257/414, 415, 257/417; 310/309, 312, 346
See application file for complete search history.

(56) References Cited

U.S. PATENT DOCUMENTS

| | | | |
|---|---|---|---|
| 5,226,321 | A | 7/1993 | Varnham et al. |
| 6,199,430 | B1 | 3/2001 | Kano et al. |
| 6,539,804 | B1 | 4/2003 | Iwata |
| 6,630,871 | B2 | 10/2003 | Ma et al. |
| 6,744,174 | B2 | 6/2004 | Paden et al. |
| 6,894,586 | B2 | 5/2005 | Bircumshaw et al. |
| 6,901,799 | B2 | 6/2005 | Chen et al. |
| 7,023,065 | B2 | 4/2006 | Ayazi et al. |
| 7,071,793 | B2 | 7/2006 | Lutz et al. |
| 7,100,446 | B1 | 9/2006 | Acar et al. |
| 7,202,276 | B2 | 4/2007 | Buchanan et al. |

(Continued)

FOREIGN PATENT DOCUMENTS

| | | |
|---|---|---|
| DE | 19938206 A1 | 2/2001 |
| DE | 10152254 A1 | 4/2003 |

OTHER PUBLICATIONS

W-T. Hsu; "Vibrating RF MEMS for Timing and Frequency References"; 2006 IEEE MTT-S International Microwave Symposium Digest, Jun. 11-16, 2006, pp. 672-675.*

*Primary Examiner* — Barbara Summons
(74) *Attorney, Agent, or Firm* — SpryIP, LLC

(57) ABSTRACT

Embodiments are related to micro-electromechanical system (MEMS) devices, systems and methods. In one embodiment, a MEMS resonating device comprises a resonator element configured to provide timing; and at least one passive temperature compensation structure arranged on the resonator element.

7 Claims, 11 Drawing Sheets

(56) References Cited

U.S. PATENT DOCUMENTS

| | | |
|---|---|---|
| 7,295,088 B2 * | 11/2007 | Nguyen et al. ............... 333/186 |
| 7,312,674 B2 * | 12/2007 | Duwel et al. ................. 333/186 |
| 7,591,201 B1 | 9/2009 | Bernstein et al. |
| 7,616,077 B1 | 11/2009 | Wittwer et al. |
| 7,639,104 B1 * | 12/2009 | Quevy et al. ................. 333/186 |
| 7,777,596 B2 * | 8/2010 | Lutz et al. .................... 333/186 |
| 7,859,365 B2 * | 12/2010 | Ho et al. ...................... 333/186 |
| 7,907,035 B2 | 3/2011 | Lutz et al. |
| 7,999,635 B1 | 8/2011 | Quevy et al. |
| 8,040,207 B2 * | 10/2011 | Winkler et al. ............... 333/186 |
| 8,058,769 B2 * | 11/2011 | Chen et al. ................. 310/313 R |
| 8,476,990 B2 * | 7/2013 | Winkler et al. ............... 333/186 |
| 2004/0041643 A1 * | 3/2004 | Giousouf et al. ............. 331/175 |
| 2009/0160581 A1 * | 6/2009 | Hagelin et al. ............... 333/200 |

* cited by examiner

- - -*- - - df ($m_1$, $k_1$)
———●——— df ($m_1$, $k_1$, $k_2$, $m_2$)
———•——— $dm_1$
- - -■- - - $dm_2$
—-△—- $dk_1$
—-*—- $dk_2$

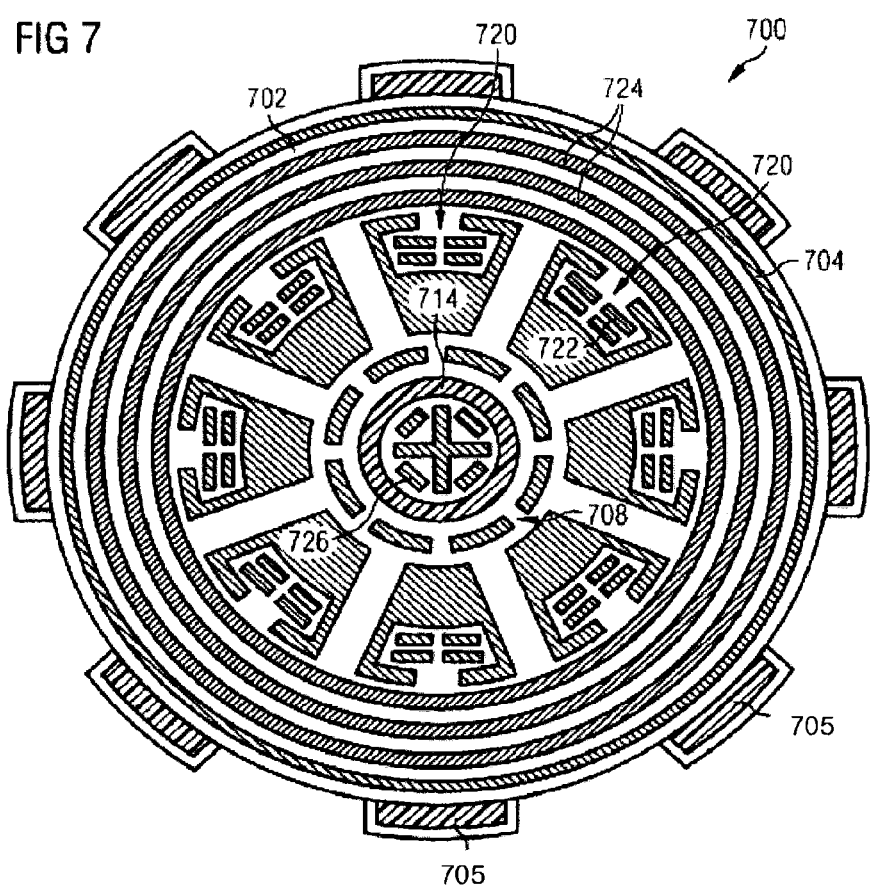

--◇-- without oxide filled structures
—△— with oxide filled structures

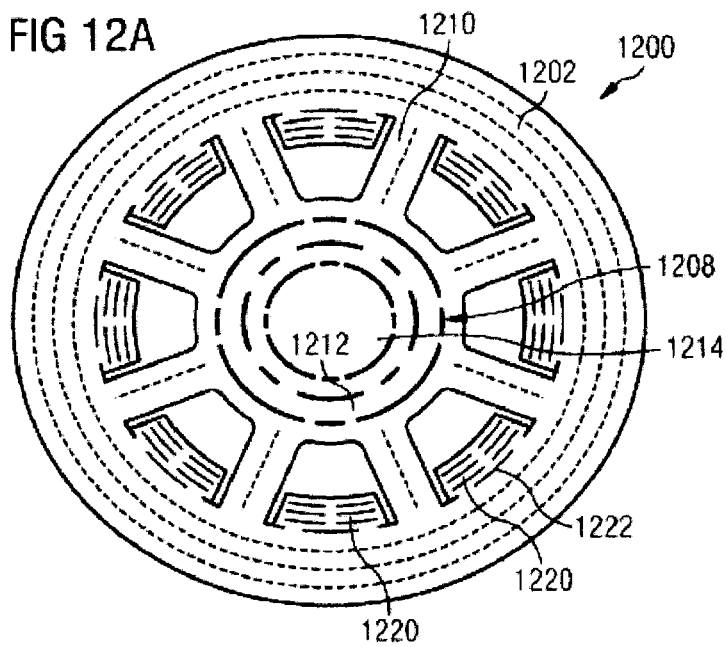
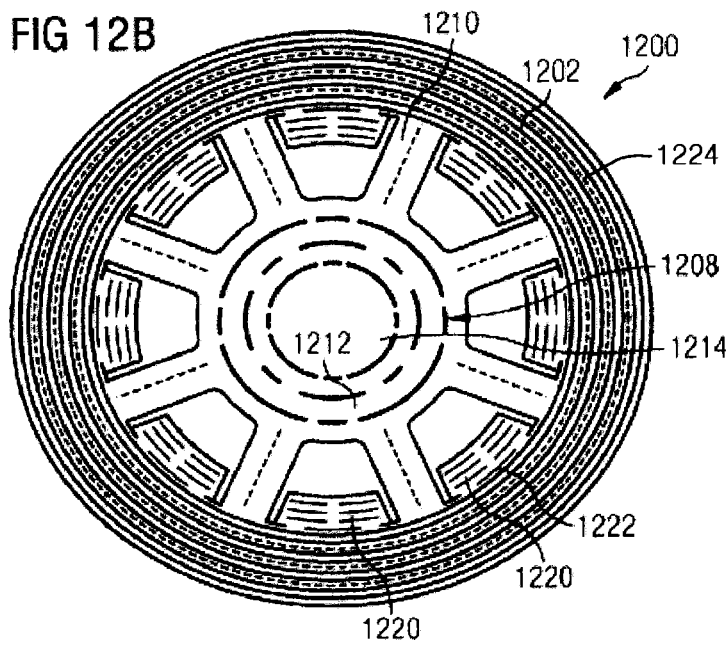

MEMS RESONATOR DEVICES

CROSS-REFERENCE TO RELATED APPLICATIONS

This application is a continuation of U.S. application Ser. No. 13/241,638, U.S. Pat. No. 8,476,990, filed Sep. 23, 2011, which is a continuation of U.S. application Ser. No. 12/354,029, U.S. Pat. No. 8,040,207, filed Jan. 15, 2009, the contents of which are incorporated herein by reference in its entirety.

BACKGROUND

For a wide range of timing applications; quartz crystals are used to supply a stable frequency reference with a typical accuracy of below +/−50 ppm over a typical temperature range of about 100° C. Improved accuracy, such as to approximately +/−1 ppm, can be achieved by frequency trimming of a combined quartz crystal resonator and oscillator circuitry system.

In some applications it is desirable to replace a quartz crystal with a micro-electromechanical system (MEMS) resonator. For example, efforts have recently been made to introduce radio frequency (RF) MEMS devices for timing applications. Compared with quartz crystals, MEMS resonators can provide reduced size as well as improved integration with an oscillator or application-specific integrated circuit (ASIC), thereby also providing reduced overall system costs.

To meet applications specifications, a MEMS resonator device often needs to have several characteristics at the same time. These characteristics can include high frequency stability, high Q-value, low supply voltage, low impedance supporting low power consumption, low phase noise and fast start-up behavior of combined system resonator-oscillator circuitry. To achieve high compatibility for different applications, it is desired to have a variable resonator frequency that is scalable by design rather than by process change. Additionally, a frequency trimming feature, such as by capacitive pulling or bias voltage trimming, is desired even for small ranges to enable a similar trimming procedure used for high accuracy quartz crystal applications. The performance parameters of resonator devices, however, depend on the process concept, such as materials, process stability and to a large extent on the resonator device design itself.

SUMMARY

Embodiments are related to micro-electromechanical system (MEMS) devices, systems and methods. In one embodiment, a MEMS resonating device comprises a resonator element configured to provide timing; and at least one passive temperature compensation structure arranged on the resonator element.

In one embodiment, a MEMS resonating device comprises a resonator element; and a passive frequency compensation structure arranged on the resonator element.

BRIEF DESCRIPTION OF THE DRAWINGS

The invention may be more completely understood from the following detailed description of various embodiments in connection with the accompanying drawings, in which:

FIG. 7 is a top view of a resonator device according to an embodiment.

FIG. 12A is top view of a resonator device according to an embodiment.

FIG. 12B is a top view of a resonator device according to an embodiment.

Figure 1:
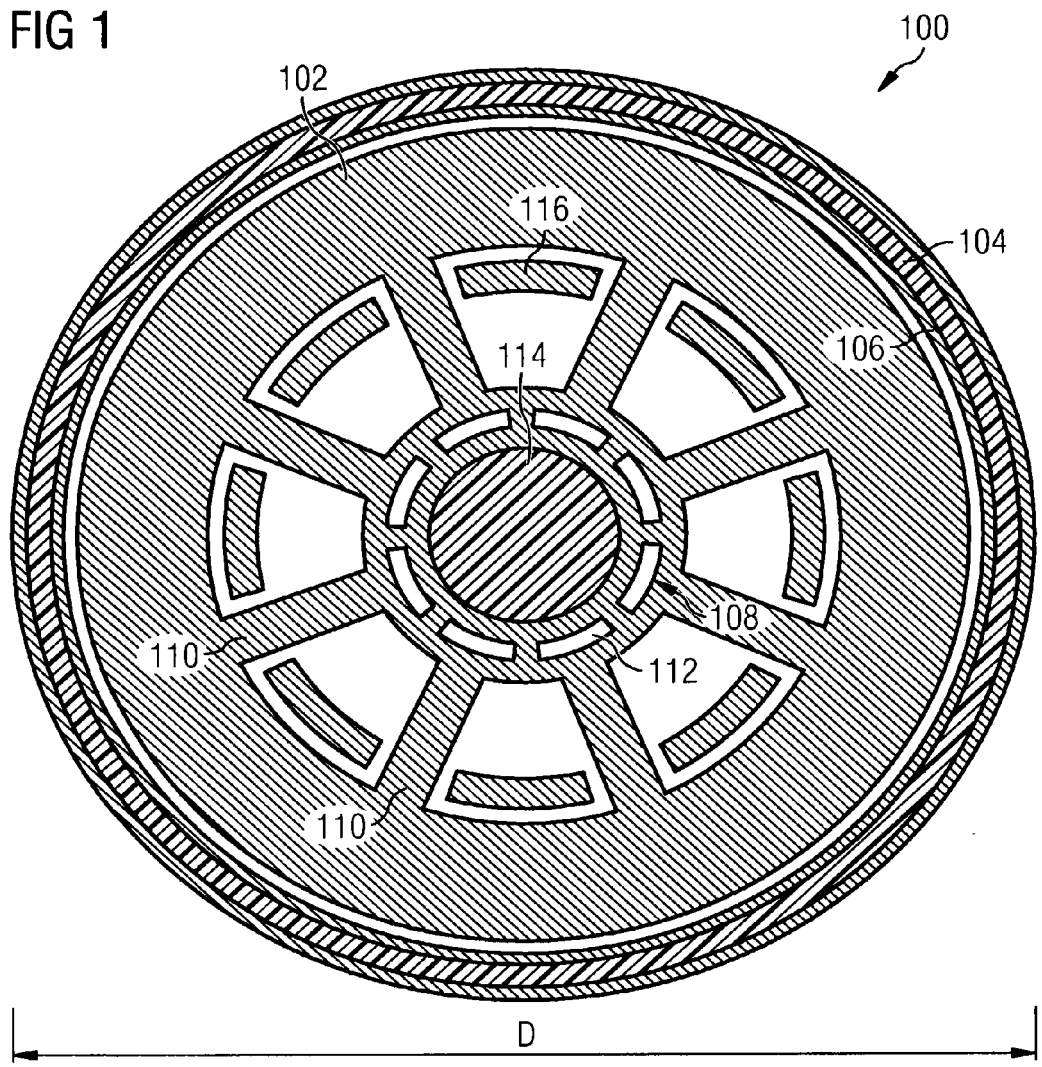
FIG. 1 is a top view of a resonator device according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments of optimized micro-electromechanical system (MEMS) resonator designs can improve performance parameters for timing applications. These parameters can include frequency stability over temperature range, low impedance at low bias voltage and good phase noise behavior at the same time. While various individual design optimizations can be implemented to address one or more of the aforementioned and other performance parameters, embodiments which provide flexible resonator designs capable of implementing several features at the same time are also disclosed. These features can include but are not limited to high mechanical spring constant and stored vibration energy by longitudinal mode shape, compatibility with narrow electrode gap and therefore low impedance, compatibility with frequency autocorrection versus process geometry variations, compatibility with passive temperature compensation, simple frequency scalability by design, and the ability for $U_{bias}$ trimming and trimming by capacitive frequency pulling due to narrow electrode gap and low impedance.

Various embodiments can be more readily understood by reference to FIGS. 1-12 and the following description. In the drawings, similar reference numerals are used throughout the various figures to refer to like elements, e.g., electrode 104 in FIG. 1 is similar to electrode 404 of FIG. 4 and electrode 504 of FIG. 5, etc. While the invention is not necessarily limited to the specifically depicted embodiment(s) and application(s), the invention will be better appreciated using a discussion of exemplary embodiments in specific contexts.

For an improved understanding of embodiments of the invention, basic relationships that apply in principle to RF-MEMS resonators are set forth below. A simplified spring-mass-damper system is used.

The natural angular frequency in radians/second is:

$$\omega = \sqrt{\frac{k}{m}}$$

where k is the mechanical spring constant and m is the effective mass of the resonator device. The signal-to-noise ratio far off the carrier, without taking into account the amplifier noise, is:

$$\frac{N}{S} \propto \frac{k_B * T}{x_c^2 * \omega * k} * Q$$

where $k_B$ is the Boltzmann constant, T is the absolute temperature, $x_C$ is the maximum vibration amplitude and Q is the resonator device Q-value.

The motional resistance $R_m$ in the electrical equivalent circuit model defining the resonator device impedance is:

$$R_m = \frac{k}{\omega * Q * \left(\frac{U_{bias} * C_0}{d}\right)^2}; C_0 = \frac{\varepsilon * A}{d}$$

where $U_{bias}$ is the DC bias voltage applied to the resonator-electrode, $C_0$ is the resonator electrode zero-capacitance, A is the electrode area, $\varepsilon$ is the dielectric constant in a vacuum and d is the resonator gap width.

For an electrostatically actuated resonator, the actuation force f can be approximated by:

$$f = \frac{\varepsilon * A}{d} * U_{bias} * U_{AC}$$

where $U_{AC}$ is the AC-voltage driving the resonator. In combination with the vibration amplitude x:

$$x = \frac{Q * f}{k}$$

$$x_C = \frac{Q * f_C}{k} = \frac{Q * \varepsilon * A}{k * d} * U_{bias} * U_{AC,max}$$

A correlation between maximum vibration amplitude $x_C$ and maximum drive voltage $U_{AC,max}$ is found. In the above, $f_C$ is the maximum actuation force corresponding to a maximum vibration amplitude $x_C$. The maximum vibration amplitude $x_C$ is defined by capacitive and mechanical nonlinearity criteria. A low level of $U_{AC}$ can have a negative impact on amplifier noise.

The above relationships show that in order to have the desired characteristics previously mentioned, including low impedance (low $R_m$), low bias voltage $U_{bias}$ and good phase noise performance, the electrode area A and mechanical spring constant k should not be too small and the resonator gap d should not be too large.

One RF-MEMS approach is the fabrication of silicon resonators in which the moving, or resonating, part of the resonator comprises polysilicon. Such devices can typically achieve a wide $U_{bias}$-trimming range but suffer from large frequency spread due to process variations, typically in the range of several tens of thousands of parts per million (ppm), limited Q-value and reduced phase noise performance due to small stored vibration energy.

A more sophisticated approach includes silicon resonators with a monocrystalline silicon device layer up to several tens of microns thick having, for example, a silicon on insulator (SOI) substrate. Such resonator devices benefit from well-defined monocrystalline material properties and can operate well in vibration mode in the plane of the device layer, thus having a frequency independent of device layer thickness and an initial frequency spread of only a few thousand ppm, an order of magnitude smaller compared to the polysilicon resonators described above.

In resonator devices using monocrystalline silicon, different designs can address different performance parameters. For example, beam structures operating in a flexural mode have a relatively small mechanical spring constant and can therefore achieve low impedance at low supply voltage, but such structures typically suffer from poor phase noise performance due to small stored vibration energy of the device. Another disadvantage of such resonator devices is a large temperature dependence of the Q-value, because in flexural beam devices the dominating loss mechanism can be thermoelastic damping which has a temperature dependence $T^{-3.5}$, where T is the absolute temperature, leading to a Q-value shift of more than a factor of two over the relevant temperature operating range.

Other resonator devices operating in pure breath mode or bulk acoustic mode typically have larger mechanical spring constants compared to a flexural beam design. Such devices can therefore achieve good phase noise, similar to quartz crystal performance, and high Q-value which is not dominated by thermoelastic damping and is therefore less dependent on temperature. A significant disadvantage of this type of resonator, however, is high bias voltage, typically in the range of several tens of volts due to the mechanically stiff structures.

MEMS resonators based on materials other than pure silicon, for example using silicon germanium (SiGe) as a resonator device material, are also known. The aforementioned competing effects of various design considerations on resonator device performance in general also apply to such devices with alternative material compounds.

Another approach to achieving optimized resonator device parameters, such as good phase noise at the same time as low impedance at low bias voltage, is to start with a bulk acoustic mode design and optimize for low bias voltage and low impedance. Referring to the described relationships in principle, resonator device design parameters like resonator gap width, mechanical spring constant, and resonator electrode area can be varied to optimize for low impedance, low bias voltage and good phase noise.

Accordingly, one embodiment of a wheel-shaped resonator device which comprises design advantages that provide improved performance is depicted in FIG. 1. In one embodiment, device 100 comprises a wheel mass 102 spaced apart from a drive electrode 104 by a gap 106. Wheel mass 102 is round in one embodiment, although other shapes and configurations are possible in various embodiments. For example, device 100 can have a circumference, a periphery with at least a portion having a radius, or some other shape in embodiments. Electrode 104 and gap 106 extend along a circumference of device 100. Device 100 also comprises an anchor region 108 coupled to mass 102 by a plurality of beam elements 110. While device 100 comprises eight beam elements 110, the number, placement and configuration can vary in other embodiments, such as according to a desired resonant frequency. A plurality of apertures 112 are formed in anchor region 108 in an embodiment, and anchor region 108 is coupled to a substrate (not shown) by an anchor portion 114. The number, configuration and placement of apertures 112 can vary in other embodiments. In one embodiment, device 100 also comprises one or more optional sense electrodes 116.

Electrode 104 provides a large electrode area, and mass 102 is configured to resonate or vibrate in a radial breath, or longitudinal, mode, capable of a large mechanical spring constant. At anchor region 108, a flexural vibration occurs in one embodiment. Thus, device 100 can include longitudinal and flexural vibrations at the same time.

An advantage of embodiments of device 100 is that the spring constant can be adjusted by a width of mass 102 to avoid high mechanical stiffness, which can lead to undesirable high bias voltage. Additionally, the center anchor region 108 and beam links 110 design of device 100 can reduce the impact of external mechanical stressors, such as packaging, on frequency stability. Sense electrodes 116 can be used to achieve a balanced resonator design, which can lead to improved phase noise performance on the oscillator level. Variations in anchor apertures 112 can be used in various embodiments to adjust the anchor loss and to achieve a desired Q-value, as the amount of vibration energy transmitted into anchor region 108 can be controlled by the size and shape of anchor apertures 112.

In various embodiments, a frequency range of device 100 is scalable according to one or more design features of device 100. For example, an outer dimension of wheel mass 102 can define the natural frequency that makes device 100 scalable according the correlation:

$$f_D \propto \frac{1}{D}$$

where D is the outer diameter of wheel mass 102 and $f_D$ is the corresponding natural frequency. In various embodiments, frequencies in the range of about 10 megahertz (MHz) to about 80 MHz can be achieved by a design variation in which diameter D ranges from about 250 micrometers (μm) to about 30 μm.

A minimum dimension of resonator gap 106 can be defined in one embodiment by process limitations and nonlinearity criteria. In various embodiments, gaps 106 of about 100 nanometers (nm) are achievable, such as through process concept described in commonly owned and copending U.S. patent application Ser. No. 12/013,174, which is incorporated herein by reference in its entirety. With a gap 106 of about 100 nm in one embodiment, additional features such as $U_{bias}$ trimming and trimming by capacitive pulling are possible, enabling active trimming features at the device level.

Embodiments of device 100 can also implement passive autocorrection of frequency spread as well as passive frequency temperature compensation. Frequency spread can be caused by process variations in the lithography and patterning of device 100 and can cause, for example, variation in trench width.

Figure 2:
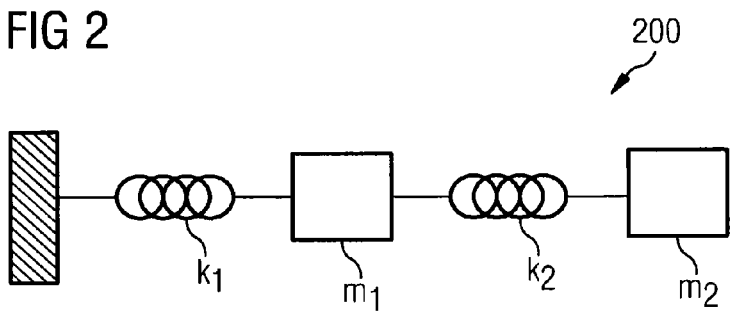
FIG. 2 is a block diagram of a system model according to an embodiment.

FIG. 2 depicts a simplified model of a resonator system 200. System 200 comprises first and second masses $m_1$ and $m_2$ and first and second springs $k_1$ and $k_2$. The analytic solution of the coupled system leads to a quadratic solution of natural frequency $f_\pm$:

$$p = \frac{k_2}{m_2} + \frac{k_2}{m_1} + \frac{k_1}{m_1}; q = \frac{k_1 * k_2}{m_1 * m_2};$$

$$f_\pm = \frac{1}{2*\pi} * \sqrt{\left[\frac{p}{2} \pm \sqrt{\left(\frac{p}{2}\right)^2 - q}\right]}$$

Of the two solutions, $f_+$ and $f_-$, $f_-$ is of practical interest, corresponding to the mode in which $m_1$ and $m_2$ vibrate in phase, and will be referred to herein.

Figure 3:
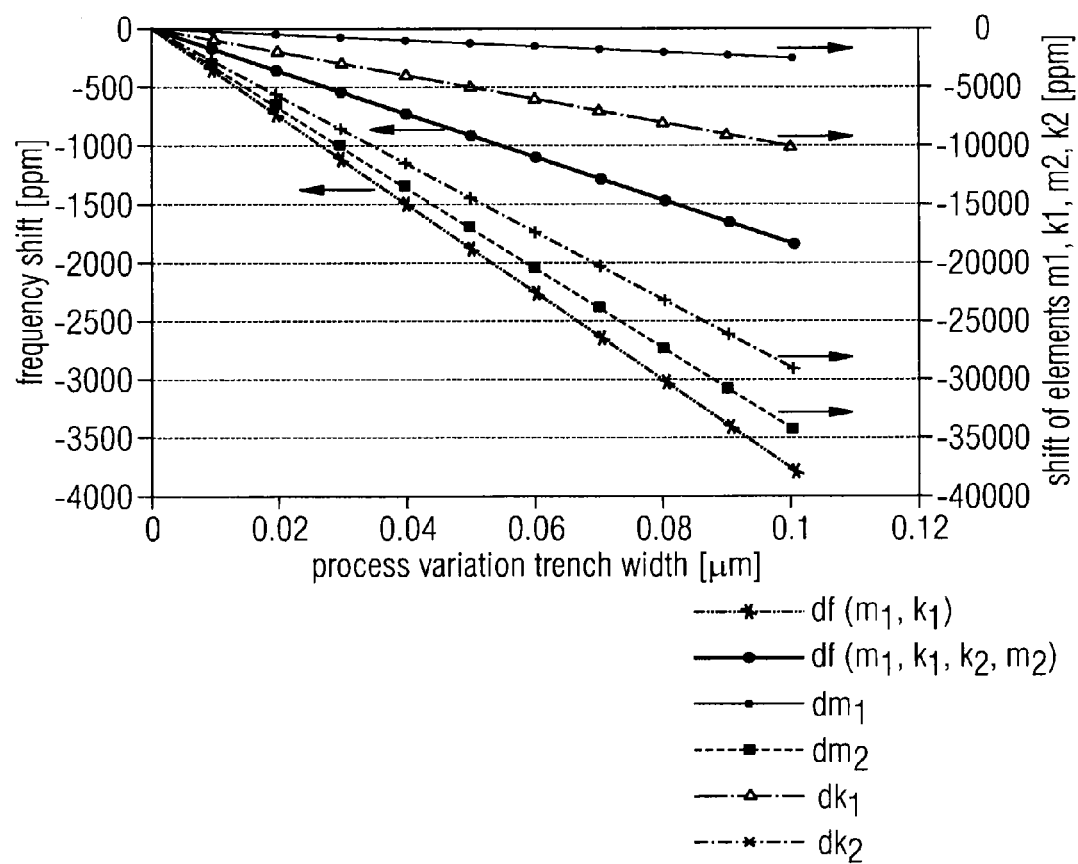
FIG. 3 is a graph of simulation results according to an embodiment.

FIG. 3 is an example simulation graph of the relationship between trench width and frequency shift in a coupled resonator system, such as model system 200. Although trench width due to process variations is shown in FIG. 3, other system characteristics and elements can also create variations, as in general all elements of system 200 can vary with trench width because of slight geometry changes. Considering a simple resonator comprising only elements $m_1$ and $k_1$, a negative frequency shift df ($m_1,k_1$) is observed because $m_1$ and $k_1$ decrease with increasing trench width, but at different ratios. To avoid a frequency shift, it would be desirable to keep the ratio $k_1/m_1$ constant. In practice, however, this is difficult to achieve with a simple resonator system, because spring constant $k_1$ typically is more sensitive to trench width than mass $m_1$. Extensive design optimization to achieve a constant ratio $k_1/m_1$ with process geometry-variation is possible in principle but can lead to an undesired design limiting resonator parameters other than frequency stability.

Another approach to achieve frequency stability versus process geometry variations is to use the additional design elements $m_2$ and $k_2$. Mass $m_2$ can be designed to have a greater sensitivity with process geometry variations. Therefore, the combined system 200 can have a significantly lower sensitivity to process variations, which provides improved frequency stability. This can be seen in FIG. 3, with the parameter df($m_1$, $k_1$, $m_2$, $k_2$). Additionally, $k_2$ can have a greater sensitivity than $m_2$, but at a typical set of values, with $m_2 \ll m_1$ and $k_2 \gg k_1$, the impact of $k_2$ to the system frequency is small and therefore $m_2$ is a relatively independent design parameter that can be adjusted to achieve frequency stability versus process geometry variations.

Figure 4:
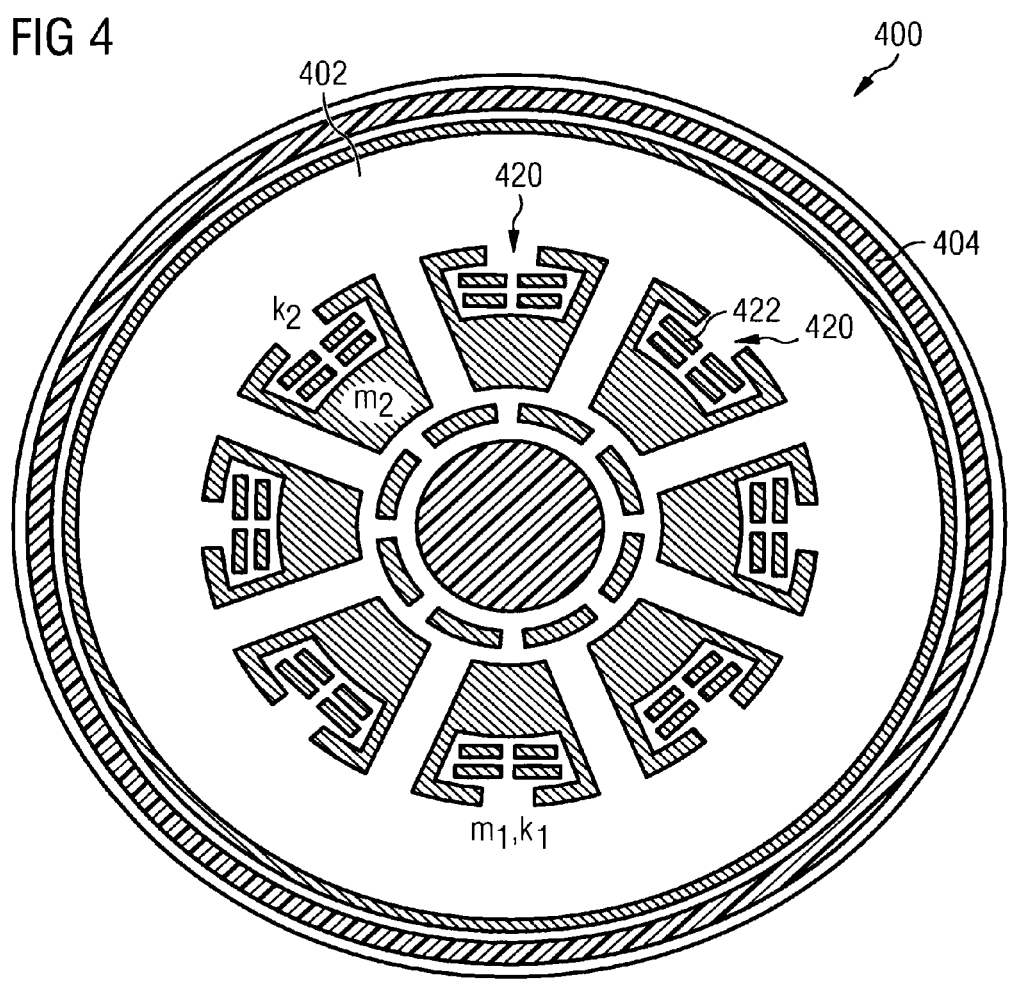
FIG. 4 is a top view of a resonator device according to an embodiment.

FIG. 4 depicts an example embodiment of a combined resonator system $m_1$, $k_1+m_2$, $k_2$ implemented as part of a wheel resonator device 400. In one embodiment, a plurality of mass elements 420, modelled as $m_2$, are coupled to or formed on a wheel mass 402, which is modelled as $m_1$ and $k_1$. Elements 420 are small compared to mass 402, m.sub.1, but comprise at least one aperture 422, modelled as $k_2$, to achieve a desired large sensitivity of $m_2$ on trench width process variations. In one embodiment, a plurality of apertures 422 are formed in each mass element 420 by device layer patterning, although the number, placement and configuration of apertures 422 can each vary in other embodiments.

In various embodiments of device 400, set values for $m_1$, $k_1$, $m_2$, and $k_2$ and frequency autocorrection, such as described above with reference to FIG. 3, can be achieved. For example, an optimized design of elements 420 for $m_2$ and sensitivity to process geometry variations can provide frequency autocorrection in one embodiment.

Embodiments of device 400 can also implement passive temperature compensation, such as by including oxide-filled structures in wheel mass 402. Passive temperature compensation of MEMS devices is described in more detail in commonly owned and copending U.S. patent application Ser. No. 12/187,443, which is incorporated herein by reference in its entirety. One or more passive temperature compensation features can be implemented separately or combined with the frequency autocorrection feature described with reference to FIGS. 3 and 4 in various embodiments. Such a combination of passive frequency compensation features can provide resonator device embodiments with a residual frequency spread of only a few hundred parts per million (ppm) over temperature range, which is an order of magnitude smaller than the initial frequency spread without passive frequency compensation.

Figure 5:
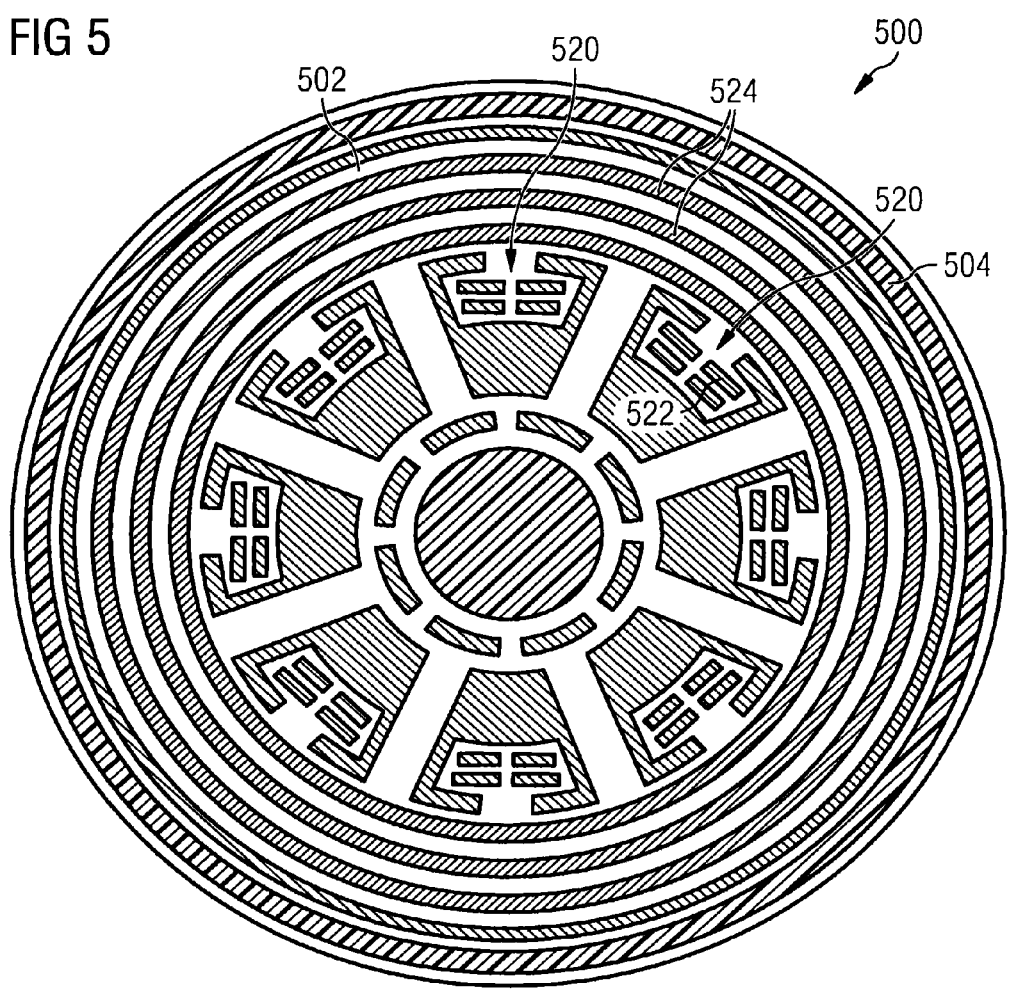
FIG. 5 is a top view of a resonator device according to an embodiment.

FIG. 5 depicts an example embodiment of a wheel resonator device 500 with combined features of frequency autocorrection of geometry variations and passive temperature compensation by oxide filled structures. Similar to device 400, device 500 comprises mass elements 520 having at least one aperture 522, although in other embodiments elements 520 and apertures 522 are omitted. Wheel mass 502 also comprises at least one passive temperature compensation structure 524. In one embodiment, a plurality of trench structures 524 are formed in mass 502 and filled with a material, such as an oxide. In other embodiments, more or fewer structures 524 are formed and/or other suitable materials are used. Structures 524 can also comprise non-contiguous fill areas spaced apart at one or more radii of wheel mass 502. Other configurations can also be used in various embodiments.

Figure 6:
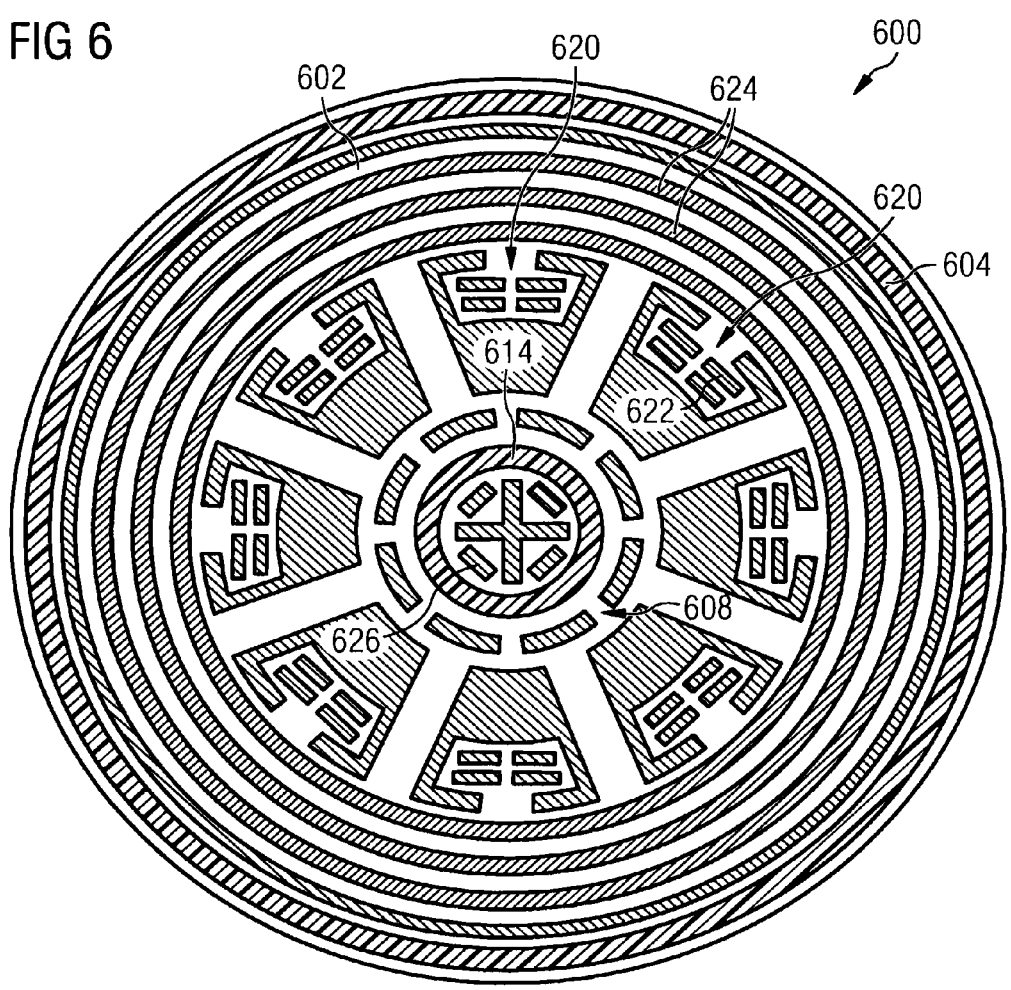
FIG. 6 is a top view of a resonator device according to an embodiment.

Optimized anchor designs can be implemented in various embodiments to reduce parasitic capacitances with the substrate, which can in turn improve noise performance. In one embodiment, and referring to FIG. 6, a center of anchor region 608 can be modified to provide additional benefits, such as by removing material, providing one or more apertures and/or otherwise reducing the size of region 608. In various embodiments, anchor region 608 can undergo an additional release etch in one embodiment to provide a smaller contact area and therefore a smaller capacitance between anchor region 608 and substrate 614 at the center of device 600. In FIG. 6, anchor region 608 of device 600 has a reduced area and comprises a plurality of zones 626, the size, pattern, configuration and other characteristics of which can vary in other embodiments. In one embodiment, zones 626 comprise apertures. In another embodiment, zones 626 comprise thinned areas. In further embodiments, zones 626 comprise a combination of apertures and thinned areas. Optimization of anchor region 608 can also be combined with one or more other optimization features described herein, such as frequency autocorrection and passive temperature compensation as depicted in FIG. 6.

Referring to FIG. 7, signal detection and noise performance of embodiments of resonator device 700 can also be optimized by reducing parasitic capacitances on resonator electrode 704. In one embodiment, this optimization can be implemented through geometry optimization and a reduction of the contact area with the substrate at the fixed resonator outer electrode 704. In one embodiment, outer electrode 704 comprises a plurality of electrode segments 705 spaced along a circumference of device 700. Outer electrode 704 comprises eight electrode segments 705 in the embodiment of FIG. 7, but other numbers, shapes, sizes and configurations on electrode 704 can be used in other embodiments. In various embodiments, this feature can be combined with one or more other features such as optimized anchor design, frequency autocorrection and passive temperature compensation, as depicted in FIG. 7.

Figure 8A:
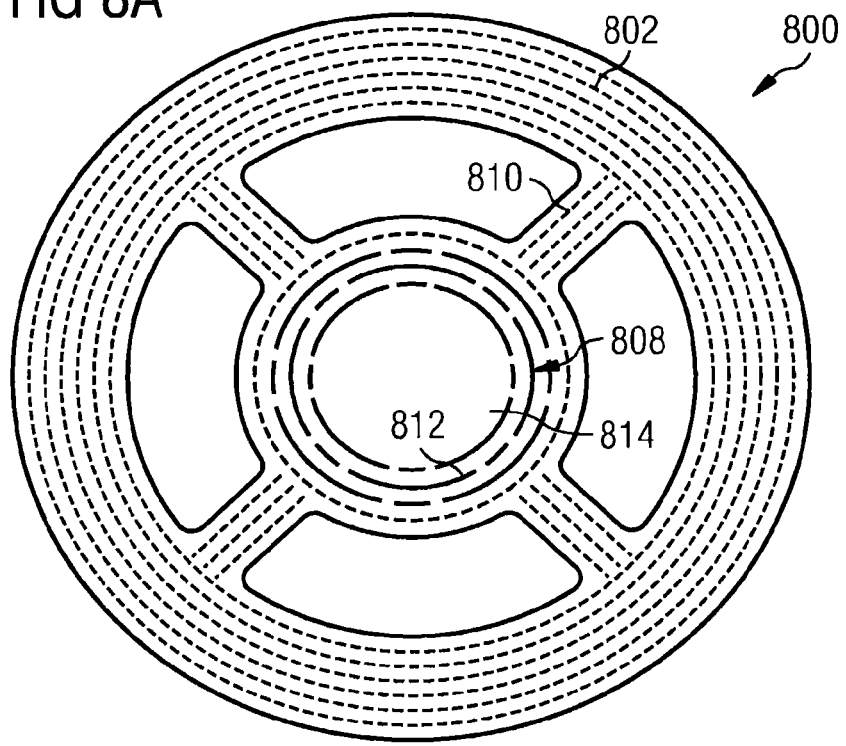
FIG. 8A is top view of a resonator device according to an embodiment.
Figure 8B:
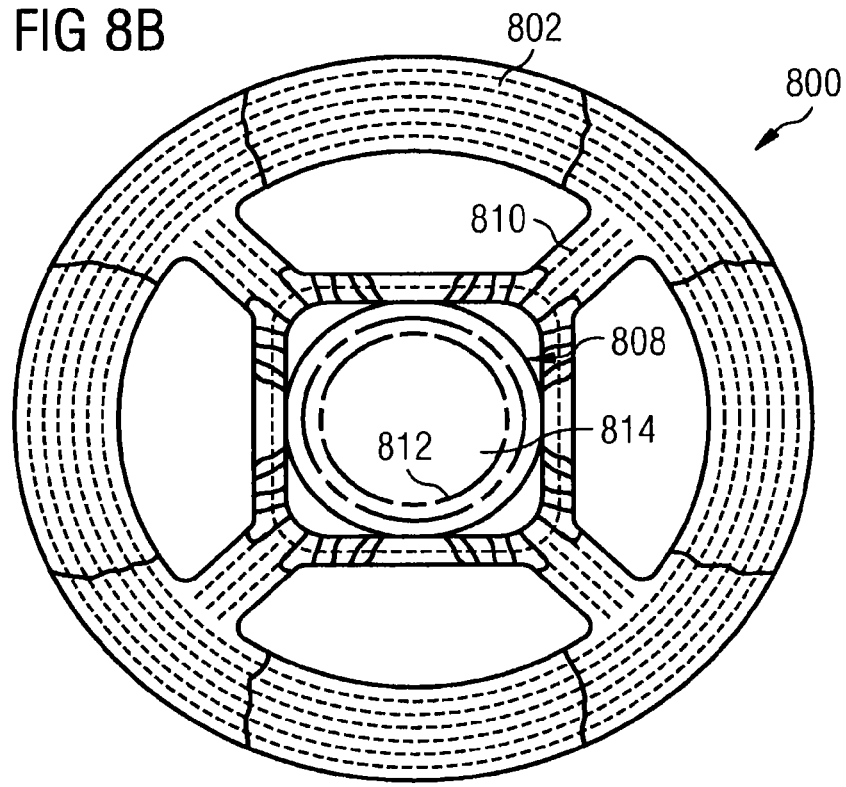
FIG. 8B is a top view of a resonator device simulation according to an embodiment.

FIG. 8 depicts a design and simulation results of one embodiment of a resonator device incorporating one or more of the optimization features described herein. FIG. 8A is a design depiction of a 13 MHz device 800, and FIG. 8B depicts a mode shape of vibration of device 800. In FIG. 8A, device 800 is shown in a neutral, non-resonating position and comprises wheel mass 802, anchor region 808, and a plurality of beam links 810. Anchor region 808 includes anchor portion 810 and a plurality of apertures 812.

The interaction of the radial breathing mode of resonation in wheel mass 802 and the flexural mode of resonation in anchor region 808 can be seen in FIG. 8B. Compared with FIG. 8A, wheel mass 802 has longitudinally contracted, while portions of anchor region 808 have flexurally deformed between anchor portion 814 and beam links 810.

Figure 9A:
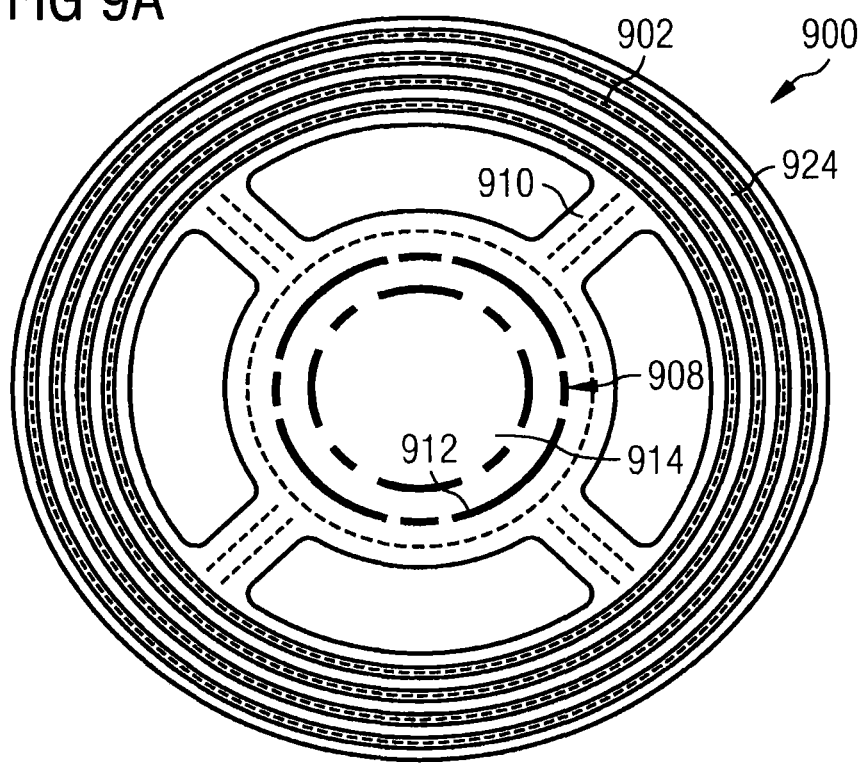
FIG. 9A is a top view of a resonator device according to an embodiment.
Figure 9B:
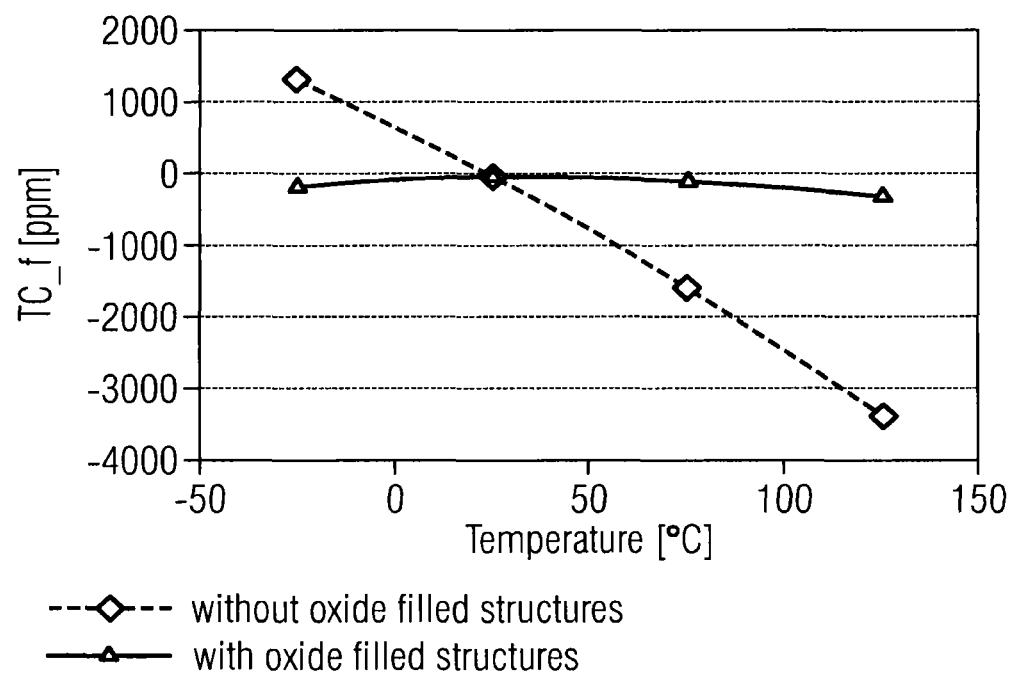
FIG. 9B is a graph of simulation results according to an embodiment.

FIG. 9A depicts another embodiment of a 13 MHz wheel resonator device 900. Device 900, similar to device 500 described above, comprises a plurality of passive temperature compensation structures 924. FIG. 9B depicts a graph of finite element simulation results for frequency over temperature of device 900. The graph shows that the thermal coefficient (TC) of frequency in device 900 with compensation structures 924 is almost zero, while an uncompensated device has a typical TC of approximately $-30$ ppm/° C.

Figure 10A:
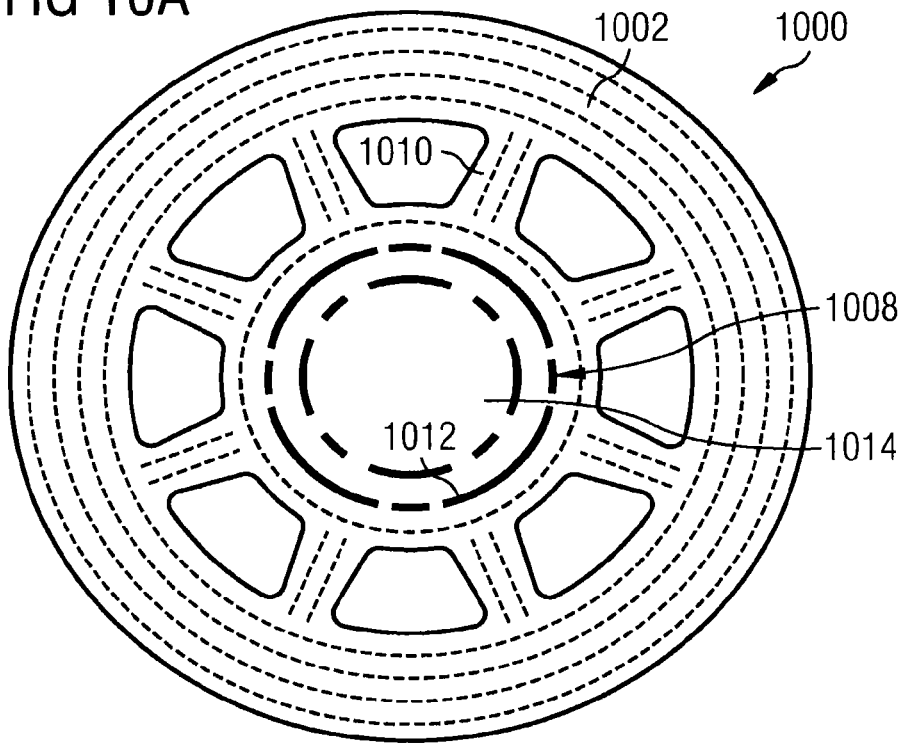
FIG. 10A is top view of a resonator device according to an embodiment.
Figure 10B:
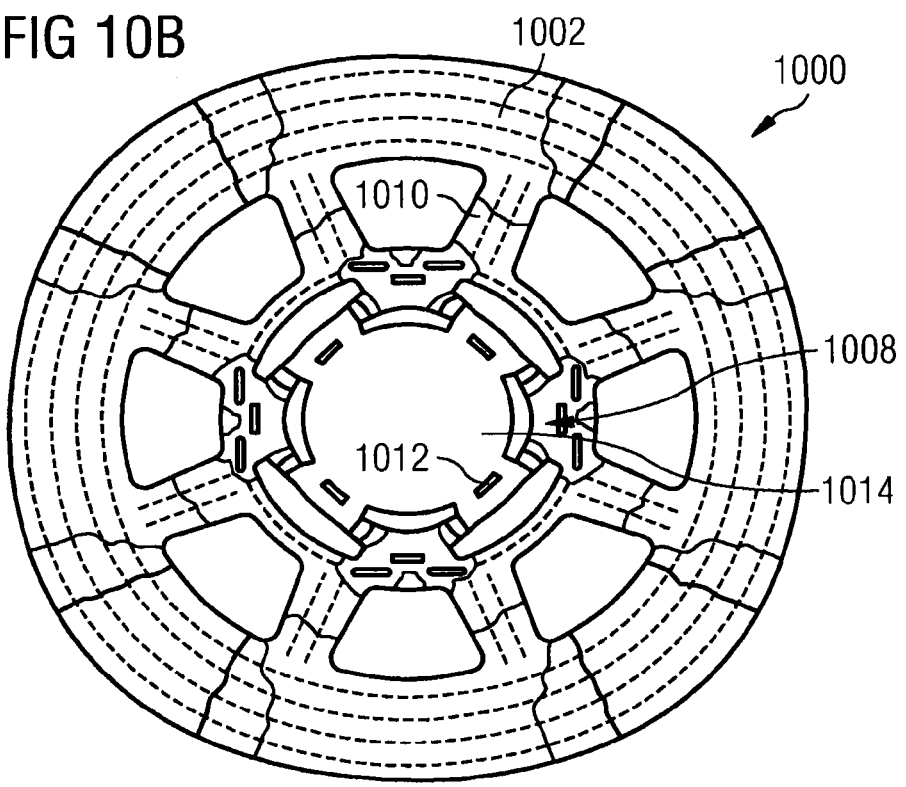
FIG. 10B is a top view of a resonator device simulation according to an embodiment.

FIG. 10 depicts design simulation results of one embodiment of a resonator device incorporating one or more of the design optimization features described herein. FIG. 10A is a design depiction of a 26 MHz device 1000, and FIG. 10B depicts a mode shape of vibration of device 1000. In FIG. 10A, device 1000 is shown in a neutral, non-resonating position and comprises wheel mass 1002, anchor region 1008, and a plurality of beam links 1010. Anchor region 1008 includes anchor portion 1014 and a plurality of apertures 1012.

The interaction of the radial breathing mode of resonation in wheel mass 1002 and the flexural mode of resonation in anchor region 1008 can be seen in FIG. 10B. Compared with FIG. 10A, wheel mass 1002 has longitudinally contracted, while portions of anchor region 1008 have flexurally deformed between anchor portion 1014 and beam links 1010. Embodiments of device 1000 are therefore optimized to achieve good resonator performance parameters and at the same time relatively good frequency stability over temperature in the range of only a few hundred ppm.

Figure 11:
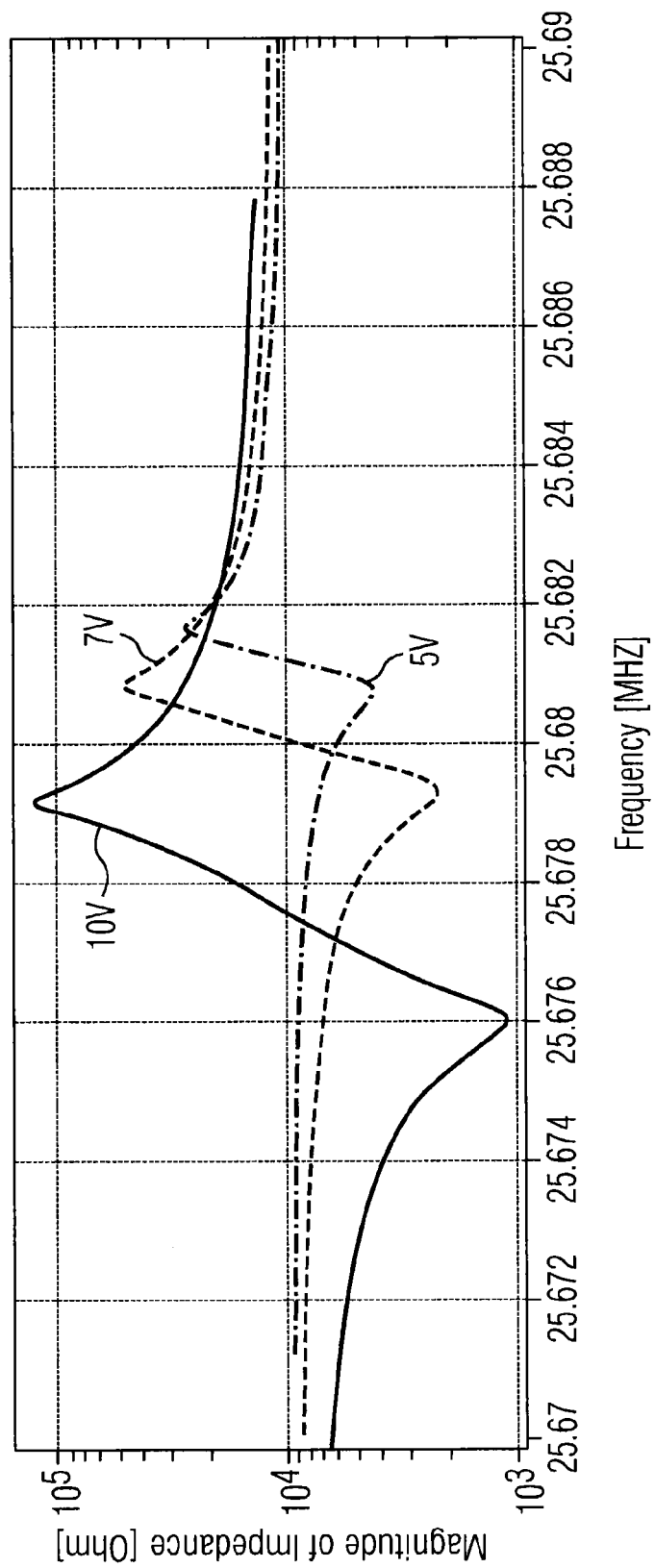
FIG. 11 is a graph of measurement results according to an embodiment.

FIG. 11 is a graph of measurement results of a basic 26 MHz wheel resonator device, such as device 1000. The electrode gap width in this example is 0.12 μm. The measured Q-value is 34000 and the motional resistance, $R_m$, is 2200 Ohm at 7 V $DC_{bias}$-voltage. The measurement result also indicates the capability for voltage-trimming with a frequency-sensitivity of $-22$ ppm/V.

FIG. 12A depicts one embodiment of a 26 MHz resonator device 1200 incorporating a plurality of frequency autocorrection elements 1220 ($m_2$) coupled to wheel mass 1202 ($m_1$). Elements 1220 comprise a plurality of apertures 1222. As previously mentioned, elements 1220 and apertures 1222 can be implemented to achieve a high sensitivity to process geometry variations and to reduce the frequency spread of the combined resonator system. FIG. 12B depicts device 1200 comprising elements 1220 as well as temperature compensation elements 1224.

Thus, embodiments of optimized MEMS resonator designs can improve various performance parameters, such as for timing applications. These parameters can include frequency stability over temperature range, low impedance at low bias voltage and good phase noise behavior at the same time. While various individual design optimizations can be implemented to address one or more of the aforementioned and other performance parameters, embodiments which provide flexible resonator designs capable of implementing several features at the same time can provide additional advantages. These features can include but are not limited to high mechanical spring constant and stored vibration energy by longitudinal mode shape, compatibility with narrow electrode gap and therefore low impedance, compatibility with frequency autocorrection versus process geometry variations, compatibility with passive temperature compensation, simple frequency scalability by design, and the ability for $U_{bias}$ trimming and trimming by capacitive frequency pulling due to narrow electrode gap and low impedance.

Although specific embodiments have been illustrated and described herein for purposes of description of an example embodiment, it will be appreciated by those of ordinary skill in the art that a wide variety of alternate and/or equivalent implementations calculated to achieve the same purposes may be substituted for the specific embodiments shown and described without departing from the scope of the present invention. Those skilled in the art will readily appreciate that the invention may be implemented in a very wide variety of embodiments. This application is intended to cover any adaptations or variations of the various embodiments discussed herein. Therefore, it is manifestly intended that this invention be limited only by the claims and the equivalents thereof.

The invention claimed is:

1. A MEMS resonating device comprising:
    a resonator element configured to provided timing, the resonator element capable to operate at least at a frequency which is between 10 megahertz (10 MHz) and about 80 MHz; and
    at least one passive temperature compensation structure arranged on the resonator element wherein the MEMS resonating device is configured such that a frequency of the resonator element does not deviate by more than 500 parts per million (ppm) in a temperature range between about −30 degrees Celsius and 130 degrees Celsius, wherein the MEMS resonating device is capable to provide both longitudinal and flexural vibrations.

2. The MEMS resonating device according to claim 1, wherein the at least one passive temperature compensation structure comprises oxide.

3. The MEMS resonating device according to claim 2, wherein the at least one passive temperature compensation structure comprises oxide-filled structure.

4. The MEMS resonating device of claim 1, wherein the MEMS resonating device is configured to provide the longitudinal resonance and the flexural vibrations simultaneously.

5. The MEMS resonating device of claim 1, wherein the MEMS resonating device is configured to operate in a frequency range between about 26 MHz and about 80 MHz.

6. The MEMS resonating device of claim 1, wherein the MEMS resonating device is configured such that a frequency of the resonator element does not deviate by more than 300 ppm in a temperature range between −30 degrees Celsius and 130 degrees Celsius.

7. The MEMS resonating device of claim 1, further comprising an anchor region coupled to a central portion of the resonator element.

* * * * *